US005206530A

United States Patent [19]
Kawamoto et al.

[11] Patent Number: 5,206,530
[45] Date of Patent: Apr. 27, 1993

[54] CHARGE TRANSFER DEVICE HAVING MULTIPLE REGISTERS

[75] Inventors: Seiichi Kawamoto; Tadakuni Narabu, both of Kanagawa, Japan

[73] Assignee: Sony Corporation, Tokyo, Japan

[21] Appl. No.: 749,616

[22] Filed: Aug. 19, 1991

Related U.S. Application Data

[63] Continuation of Ser. No. 516,273, Apr. 30, 1990, abandoned.

[30] Foreign Application Priority Data

May 2, 1989 [JP] Japan .................. 1-113448

[51] Int. Cl.⁵ .......................... H01L 29/796
[52] U.S. Cl. ........................ 257/231; 257/241; 257/249
[58] Field of Search ............ 357/24 LR, 24 R, 68

[56] References Cited

U.S. PATENT DOCUMENTS

| | | | |
|---|---|---|---|
| 3,983,573 | 9/1976 | Ishihana | 357/24 LR |
| 4,001,878 | 1/1977 | Weimer | 357/24 LR |
| 4,353,084 | 10/1982 | Herbst | 357/24 LR |
| 4,528,594 | 7/1985 | Kadekadi et al. | 357/24 LR |
| 5,164,807 | 11/1992 | Theuwissen | 257/231 |

FOREIGN PATENT DOCUMENTS

| | | |
|---|---|---|
| 0127223 | 12/1984 | European Pat. Off. |
| 2537369 | 6/1984 | France |
| 63-14467 | 1/1988 | Japan |

OTHER PUBLICATIONS

IBM Technical Disclosure Bulletin, vol. 20, No. 1, Jun. 1977, pp. 436-437, New York,-USA; S. G. Chamberlain et al.: "Silicon solid-state FET color scanner".

Primary Examiner—William D. Larkins
Attorney, Agent, or Firm—Limbach & Limbach

[57] ABSTRACT

A charge transfer device has a plurality of registers which run parallel to each other and across which electrical charges are transferred. For efficient charge transfer across the registers, the transfer elecrtrode of one register and the transfer electrode of an adjacent register are arrayed in contiguity to each other and driven by different driving pulses and a deeper potential is provided in the signal charge receiving side than in the signal charge forwarding side. The registers are arrayed parallel to a sensor row constituted by a linear array of different color sensors and each handle signal charges of the respective colors. In this manner, the outputs from the registers are in the form of the separate color signals to prevent color mixing.

4 Claims, 6 Drawing Sheets

CHARGE TRANSFER DEVICE HAVING MULTIPLE REGISTERS

This is a continuation of co-pending application Ser. No. 07/516,273 filed on Apr. 30, 1990, now abandoned.

BACKGROUND OF THE INVENTION

1. Field of the Invention

This invention relates to a charge transfer device having plural registers arranged in parallel with one another.

2. Description of the Prior Art

In a charge transfer device in general, such as a CCD, a region called a register for charge transfer is formed on its chip. A transfer electrode for potential control is formed in a side-by-side relation with respect to the register of the charge transfer device, and a channel region operating as the charge transfer route is formed below the transfer electrode.

The CCD solid state imager is a device consisting essentially of such a charge transfer mechanism and an annexed sensor for opto-electric conversion. Above all, in a color solid state imager, there are formed filters of different color transmission types, and sensors associated with the different colors. For example, in a color linear sensor, there are formed one or more rows of sensors for outputting signals of different colors. In a device in which the sensors associated with the different colors are arrayed sequentially in a row, a register is provided in parallel with the sensor row. Signals of the different colors are collectively transferred to the register from the sensors so as to be allocated and read out in the order in which they are output. In a device in which plural rows of sensors are formed, a register is provided for each sensor row and outputs an associated one of the three color signals.

The number of the registers in the charge transfer device may not be one, and there may be cases wherein a plurality of registers are formed. When a plurality of registers are provided in parallel with one another, it becomes necessary to transfer electrical charges across the registers.

FIG. 1 shows to an enlarged scale the region between the adjacent registers of a conventional charge transfer device. A first polysilicon layer 101 is formed along the direction H. This first layer of polysilicon functions as a transfer gate between the registers. A second layer of polysilicon 102 and a third layer of polysilicon 103 are alternately formed at a predetermined pitch along the direction H shown in FIG. 1. The patterns of these polysilicon layers 102, 103 are extended in the direction V in FIG. 1 with obliquely extending portions over the polysilicon layer 101. The polysilicon layers 102, 103 function in common as the transfer electrodes for the first and second registers 104, 105 and are operated by two-phase driving. When the charges are transferred in the direction V, that is, across the registers 104, 105, a pulse is transmitted to the first polysilicon layer 101, and the electrical charges in the first register 104 are transiently stored in a lower portion of the first polysilicon layer 101. The charges thus stored in the first polysilicon layer 101 are then transferred to the second register 105.

However, with a color linear sensor, should the sensors associated with the different colors be arrayed sequentially in one sensor row, signal charges read into the registers may be degraded as they are being transferred in the registers, so that color mixing may occur in the produced image. Should a plurality of rows of registers be formed in association with a plurality of rows of sensor rows, the sensor rows may be unavoidably different in their positions to increase the load in signal processing.

On the other hand, should electrical charges be transferred across a plurality of registers, as shown in FIG. 1, the first layer of polysilicon 101 need be formed in a long pattern length along the direction H shown therein. However, a linear sensor or the like having a longer length along the direction H has an increased resistance. Also, when the charge transfer in the direction H is to be achieved by two phase driving, electrical charges need be transiently stored in a lower portion of the first layer of polysilicon 101 with consequent deterioration in the transfer efficiency.

SUMMARY OF THE INVENTION

It is therefore an object of the present invention to provide a charge transfer device having an improved charge transfer efficiency across plural registers.

It is another object of the present invention to provide a charge transfer device which is less subject to color mixing.

According to the present invention, there is provided a charge transfer device including a sensor row formed by a linear array of first, second and third sensors associated with respective different color transmitting filters and adapted for receiving respective different lights by way of said filters, a first register associated with the first sensors, a second register associated with the second sensors, and a third register associated with the third sensors, these first to third sensors being formed in parallel with the sensor row. In the charge transfer device of the present invention, since the registers are associated with the respective color sensors, each of the registers is associated with a specific one of the three prime color signals to prevent color mixing. Since the sensors are arrayed in a row, the outputs from the sensors are in the form of separate color signals.

In another aspect of the present invention, the different color transmitting filters are those including at least three filter units for a combination of red, green and blue or for a combination of cyan, yellow and magenta. The registers formed in parallel with the sensor row may be provided on one or both lateral sides of the sensor row.

In another charge transfer device of the present invention, electrical charges are transferred across at least a first register and a second register, arranged parallel to each other, a transfer electrode of the first register and a transfer electrode of the second register are arrayed in contiguity to each other for realizing the charge transfer across the first and the second registers, and are driven by different pulses. During charge transfer across the registers, the potential of at least the charge receiving side transfer electrode is made deeper than the potential of the charge forwarding side transfer electrode. With the transfer electrodes of the adjacent registers thus arrayed in contiguity to each other, direct charge transfer may be realized across the transfer electrodes for improving the transfer efficiency.

In yet another aspect of the present invention, the transfer electrodes arrayed in contiguity to each other may have an enlarged width at the point of contiguity, i.e. on the electrode junction region. A transfer region may also be formed at the junction side of the charge receiving one of the transfer electrodes which are arrayed in contiguity to each other for realizing charge transfer across the associated registers.

DETAILED DESCRIPTION OF THE PREFERRED EMBODIMENTS

First Embodiment

The present embodiment shows an example of a CCD which is provided with first and second registers and in which electrical charges may be transferred not only in the interior of each of the registers but across adjacent ones of the registers.

Figure 1:
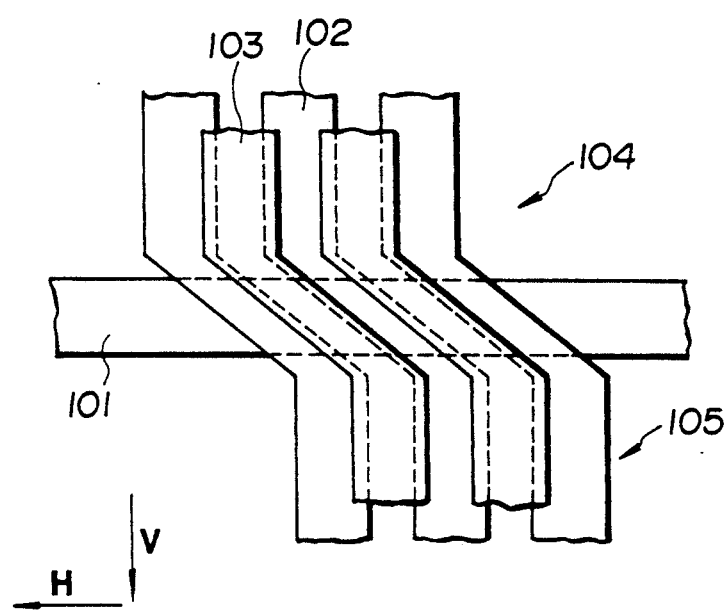
FIG. 1 is a plan view showing essential portions of a typical conventional charge transfer device.
Figure 2:
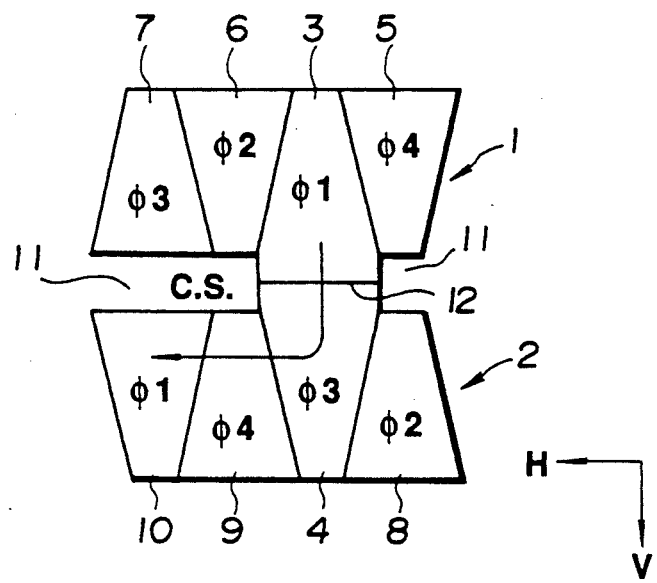
FIG. 2 is a plan view showing essential portions of an embodiment of a charge transfer device according to the present invention.

FIG. 2 shows in plan essential view the registers of the CCD in which a first register 1 and a second register 2 are formed in parallel with each other for transferring electrical charges in the direction H on a semiconductor substrate. On this FIG. 2, only two sets of the transfer electrodes in each of the registers are shown, for the sake of simplicity. The first register 1 has transfer electrodes 5, 3, 6 and 7, while the second register 2 has transfer electrodes 8, 4, 9 and 10. Although not shown, channels for charge transfer are formed in the lower regions of the transfer electrode 3 to 10. The transfer electrode 3 of first register 1 has one side contiguous to one side of the transfer electrode 4 of second register 2. No transfer gate or the like is provided between the transfer electrodes 3 and 4. Although these transfer gate 3, 4 are contiguous to each other, the remaining transfer electrodes 5, 6 and 7 of the first register 1 are electrically isolated from the electrodes 8, 9 and 10 of the second register 2 by a channel stop region 11 formed between the first and the second registers 1, 2. The transfer electrode 3 has an increasing width towards the second register 2. Thus the electrode 3 has substantially a trapezoidal form and has an increased width in the transfer direction or in the direction V. Similarly the transfer electrode 4 has substantially a trapezoidal form and has a progressively increasing width towards the junction with the transfer electrode 3. The remaining transfer electrodes 5 to 10 are also of substantially a trapezoidal form. As will be later explained in further detail in reference to FIGS. 9 and 10, the reason the transfer electrodes 3 to 10 are substantially of a trapezoidal form is to provide a deeper potential and a shallower potential on the perimeter of the transfer electrode at the enlarged sides and the narrow sides, respectively, for improving the transfer efficiency.

The transfer electrodes 3 to 10 are formed by, for example, of three polysilicon layers. In the present embodiment, the transfer electrodes 4 and 7 are formed by a first polysilicon layer and the transfer electrodes 3 and 10 are formed by a second polysilicon layer. That is, at a junction region 12 where charge transfer between the registers occurs, the transfer electrode 3 is partially overlapped with the transfer electrode 4. The transfer electrodes 5, 6, 8 and 9 are formed by a third polysilicon layer. Although not shown, those polysilicon layers which are supplied with the same phase signals as later described are contiguous to each other over the channel stop region 11.

A phase 1 signal $\phi 1$ is supplied to transfer electrodes 3 and 10, and a phase 3 signal $\phi 3$ is supplied to transfer electrodes 4 and 7. A phase 2 signal $\phi 2$ or a phase 4 signal $\phi 4$ are supplied to transfer electrode 5, 6, 8 and 9 formed by the third polysilicon layer. More specifically, the phase 4 signal $\phi 4$ is supplied to transfer electrodes 5 and 9 and the phase 2 signal $\phi 2$ is supplied to transfer electrodes 6 and 8.

With the above described CCD of the present embodiment, not only the transfer between the register, that is the transfer in the direction V, but also the transfer within the registers, that is the transfer in the direction H, may be realized.

Figure 3:
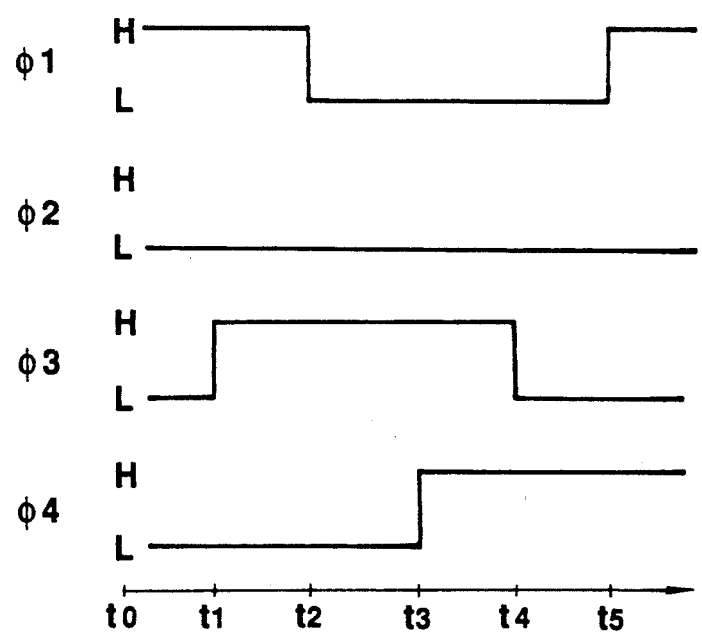
FIG. 3 is a waveform diagram for illustrating the charge transfer process in the charge transfer device shown in FIG. 2.

Referring to FIG. 3, the case is illustrated in which the charges present in the transfer electrode 3 are to be transferred to the transfer electrode 10. At time $t_0$, only the phase 1 signal $\phi 1$ is set to an "H" level, with the remaining signals $\phi 2$ to $\phi 4$ being set to an "L" level. At this time, the electrical charges are stored in a lower portion of the transfer electrode 3. As the phase 3 signal $\phi 3$ goes at the next clock time $t_1$ to the "H" level from the "L" level, the charges in the transfer electrode 3 start to flow into the transfer electrode 4. Since the transfer electrodes 8, 9 adjacent to the transfer electrode 4 within the register 2 are both at the "L" level, charge transfer is confined to the region of the transfer electrode 4. At the next clock time $t_2$, the first phase signal $\phi 1$ goes to the "L" level. The potential at the charge receiving side transfer electrode 4 then becomes deeper than the potential of the charge transmitting side transfer electrode 3, so that the totality of the charges stored in the transfer electrode 3 flows to the transfer electrode 4 to effect charge a transfer across the registers. Then, at time $t_3$, the phase 4 signal $\phi 4$ goes from the "L" level to the "H" level, so that the charges which have been transferred to the transfer electrode 4 flow into the transfer electrode 9. Then, at time $t_4$, the signal $\phi 3$ applied to the transfer electrode 4 goes to the "L" level, so that the charges are stored in the transfer electrode 9. At the next clock time $t_5$, these charges are transferred to the transfer electrode 10.

For a charge transfer within the same register, the signal supplied to the transfer electrode to which the charges are to be transferred is raised from the "L"

level to the "H" level. The signal supplied to the transfer electrode in which charges have been stored is lowered from the "H" level to the "L" level. The above sequence of operations is repeated sequentially from one to the next transfer electrode. With the above described control of the transfer electrodes, during charge transfer within the same register, the phase 1 signal $\phi 1$ and the phase 3 signal $\phi 3$, supplied respectively to the transfer electrodes 3, 4, responsible for charge transfer across the registers, are not changed in level simultaneously, nor are they set to the "H" level simultaneously, such that, when charges exist in one of the electrodes 3 or 4, the remaining electrode 4 or 3 is maintained at the "L" level without fail, thereby realizing positive charge transfer in the direction H within the same register.

Hence, with the CCD of the present embodiment, the transfer electrodes contiguous to each other are driven by different pulses to effect not only the transfer across the registers in the direction V but also the transfer within the same register in the direction H. Since the transfer between the registers takes place between the transfer electrodes 3, 4 which are contiguous to each other, transfer gates or the like may be eliminated. In addition, the problem of the gate resistance is obviated and the transfer efficiency is also improved. Above all, since the transfer electrodes 3, 4 are contoured so that the electrode widths are progressively increased towards the junction region 12, the transfer efficiency is further improved.

Second Preferred Embodiment

The present embodiment gives an example of a linear type color CCD having first to third registers.

Figure 4:
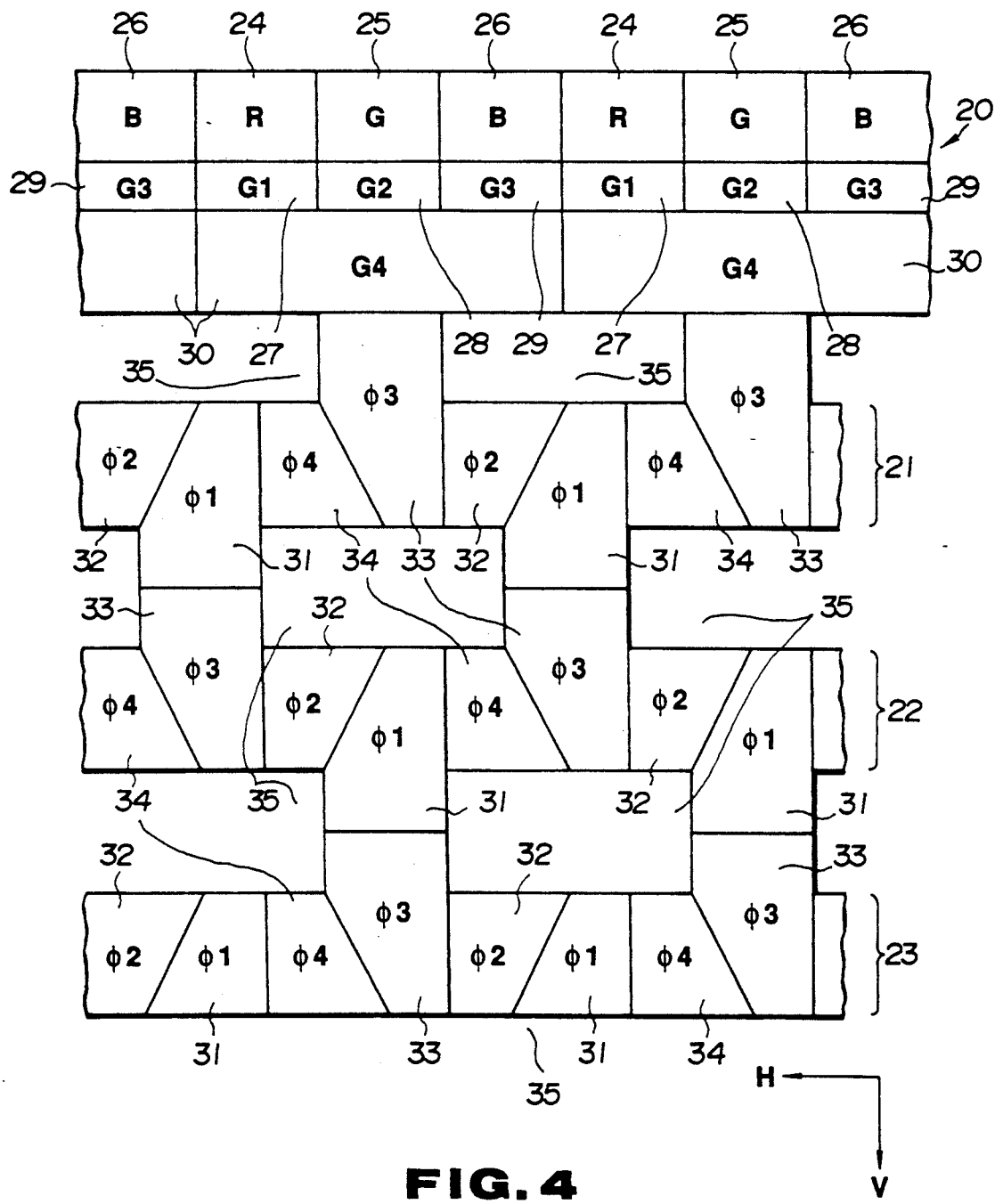
FIG. 4 is a plan view showing essential portions of a second embodiment of a charge transfer device according to the present invention.

FIG. 4 shows the essential portions of the CCD. A sensor row 20 is formed with the direction H as the longitudinal direction. The sensor row 20 is constituted by a sequential linear array of first sensors 24 each having a filter for receiving a red (R) light, second sensors 25 each having a filter for receiving a green (G) light and third sensors 26 each having a filter for receiving a blue (B) light. The electrical charges corresponding to the red color signal, green color signal and the blue color signal are produced at the first, second and the third sensors 24, 25 and 26, respectively.

In the direction V of the sensor row 20, there are formed gate regions 27 to 30. These gate regions 27 to 30 function as the gates for selectively reading out signal charges from sensor row 20 for each of the sensors 24 to 26. Thus the gate region 27 supplied with the signal G1 is provided on the V direction side of the first sensor 24, and the gate region 28 supplied with the signal G2 is provided on the V direction side of the second sensor 25. Similarly, the gate region 29 supplied with the signal G3 provided on the V direction side of the third sensor 26. For each set of the adjacent gate regions 27 to 29, the gate region 30 controlled by the signal G4 is formed on the V direction side of the gate regions 27 to 29. This gate region 30 connects to a first register 21 which will be explained subsequently. The electrical charges are selectively read out from the sensor row 20 for each color signal when only one of the signals G1 to G3 is at the readout level, such as the "H" level and the signal G4 applied to the gate region 30 is simultaneously at the readout level.

With the present illustrative embodiment of the CCD, first to third registers 21 to 23 are formed in parallel with the sensor row 20 having the gates each associated with one of the sensors 24 to 26. In each of the registers 21 to 23, transfer electrodes 31, 32, 33 and 34 are repetitively arrayed in this sequence in the direction H. A phase 1 signal $\phi 1$ is supplied to the transfer electrodes 31 and a phase 2 signal $\phi 2$ is supplied to the transfer electrodes 32. Similarly, a phase 3 signal $\phi 3$ is supplied to the transfer electrodes 33 and a phase 4 signal $\phi 4$ is supplied to the transfer electrode 34. The transfer electrodes 32 and 34 are electrically isolated from each other by a channel stop region 35 without any contact across the registers and are contiguous to the other transfer electrodes 31, 33 only within one and the same register. The transfer electrode 31, sandwitched between the transfer electrodes 32 and 34 within each of the registers 21 to 23, is contiguous on one side in the direction V across the first and second registers 21 and 22, to the confronting side of the transfer electrode 33 of the other registers. Beside the role as the horizontal transfer electrode in each register, the transfer electrode 31 plays the role of a transfer electrode for forwarding the charges across the first registers 21 and the second registers 22.

The transfer electrode 33, similarly sandwitched between the transfer electrode 32 and 34 within each of the register 21 to 23, is contiguous on one side to the confronting side of the transfer electrode 31 of the remaining register in the direction V. Besides the role as the horizontal transfer electrode in each register, the transfer electrode 33 plays the role of the charge receiving side transfer electrode in transferring the charges across the registers and transferring the charges from the sensor row 20.

The transfer electrodes 32 and 34 are substantially of a trapezoidal form while the transfer electrode 31 is enlarged in width towards the transfer electrode 33 and the transfer electrode 33 is enlarged in width towards the transfer electrode 31. This allows the potential of the enlarged portion to be deeper than that of the narrow portion to raise the transfer efficiency of the transfer across the registers or within one and the same register.

The transfer electrodes 31 to 34 of the registers 21 to 23 may be formed by, for example, three polysilicon layers, similarly to the first embodiment. In the present second embodiment, the transfer electrode 33 is formed by a first polysilicon layer and the transfer electrode 31 is formed by a second polysilicon layer. The transfer electrodes 32 and 34 are formed by a third polysilicon layer. Although not shown, these layers may be extended over the channel stop region 35 and the layers supplied with the same phase signals are connected to one another on the channel stop region.

Figure 5:
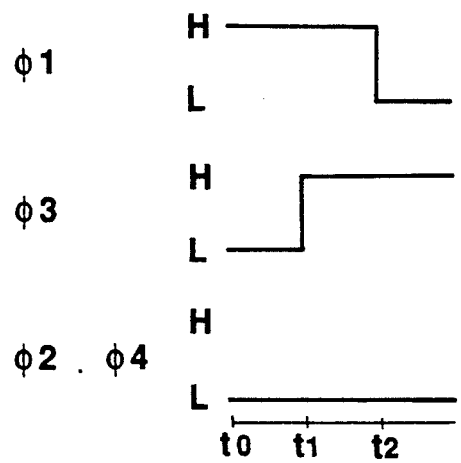
FIG. 5 is a waveform diagram for illustrating the charge transfer process in the direction V in the embodiment shown in FIG. 4.

The charge transfer process in the direction V will be explained by referring to FIG. 5. It is supposed that, by the selective operation of the gate regions 27 to 30, the charges associated with the color signals selectively transferred from the sensors 24 to 26 have been transferred and stored in the lower region of the transfer electrode 31. The signal $\phi 1$ is at the "H" level and the remaining signals $\phi 2$ to $\phi 4$ are at the "L" level (at time $t_0$). When the charges are to be transferred across the registers, the signal $\phi 3$ is changed to "H" level at time $t_1$, with the charges stored in the lower portion of the transfer electrode 31 flowing towards the lower portion of the transfer electrode 33. The signal $\phi 1$ then is changed at time $t_2$ from the "H" level to the "L" level, with the potential of the charge receiving side transfer electrode 33 becoming deeper than the potential of the charge forwarding side transfer electrode 31. The totality of charges stored in the transfer electrode 31 are transferred to the transfer electrode 33, with the charges being stored only in the lower portion of the transfer electrode 33. During this time interval, the signals $\phi 2$ and $\phi 4$ are always at the "L" level, with no electrical charges flowing into the transfer electrodes 32, 34 to which these signals are supplied. The electrical charges are transferred in this manner in the direction V by these driving pulses. It is noted that transfer of charges from the sensor row 20 to the first register 21, from the first register 21 to the second register 22 and from the second register 22 to the third register 23 may be performed by fully parallel operation.

Figure 6:
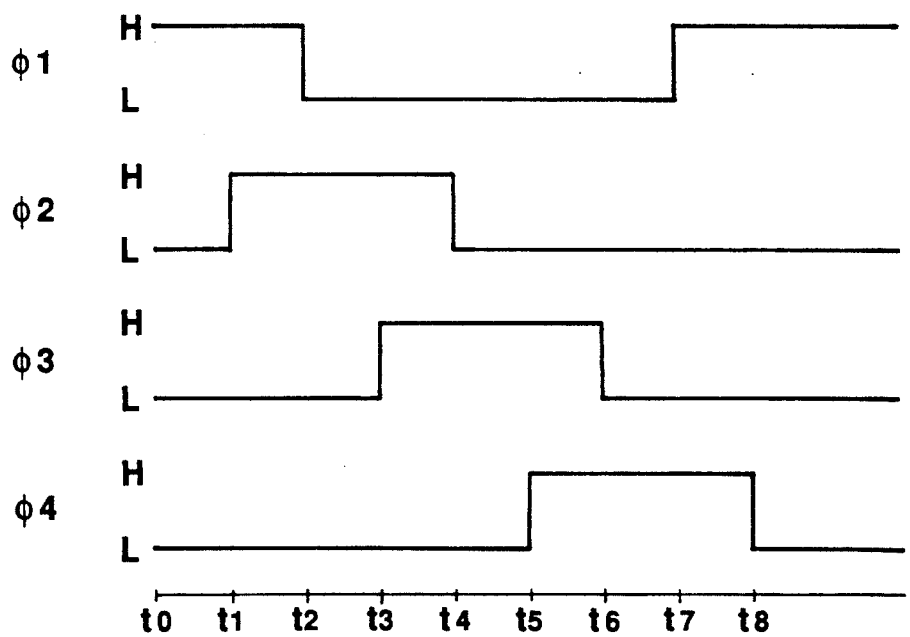
FIG. 6 is a waveform diagram for illustrating the charge transfer process in the direction H in the embodiment shown in FIG. 4.

The charge transfer process in the direction H, that is the charge transfer in one and the same register, is explained by referring to FIG. 6. Such charge transfer in the direction H is performed by a repetitive alternative of a clock causing the charges to be stored in a region of two transfer electrodes and a clock causing the charges to be stored in a region of only one transfer electrode.

At time $t_0$, only the signal $\phi 1$ is at the "H" level, while the other signals $\phi 2$ to $\phi 4$ are at the "L" level. Therefore, even when the signal $\phi 1$ is at the "H" level, since the signal $\phi 3$ is at the "L" level, no charges flow out of the register of the transfer electrode 31 towards the region of the transfer electrode 33.

At time t1, the signal $\phi 2$ is changed from the "L" level to the "H" level. The charges thus far present only in the region of the transfer electrode 31 flow into the region of the transfer electrode 32. At time $t_2$ the signal $\phi 1$ is changed to the "L" level, so that charges continue to be stored only in the lower portion of the transfer electrode 32.

Then, with the signal $\phi 1$ at the "L" level, and with electrical charges becoming depleted in the region of the transfer electrode 31, the signal $\phi 3$ is changed to the "H" level (time $t_3$). As a result, electrical charges in the region of the transfer electrode 32 flow into the region of the contiguous transfer electrode 33. Since the signal $\phi 1$ is at the "L" level, charges cannot be transferred into the region of any of the transfer electrodes 33 via the region of any of the transfer electrodes 31. At time $t_4$ the signal $\phi 2$ goes to "L" level, with the charges being stored only in the transfer electrode 33.

In time $t_5$ to $t_8$, signal $\phi 4$ goes to the "H" level. The signal $\phi 3$ then goes to the "L" level, with the signal $\phi 1$ again going to the "H" level. The charges in the region of the transfer electrode 33 thus are transferred to the region of the transfer electrode 31 via the region of the transfer electrode 34. During this time interval, it cannot occur that the signals $\phi 1$ and $\phi 3$ go to the "H" level simultaneously or are changed in level at the same timing, so that charges cannot be transferred across the adjacent registers in the direction V. By such charge transfer in the direction H in the registers 21 to 23, electrical charges associated with the respective color signals may be taken out at the registers 21 to 23.

With the above described embodiment of the CCD, charge transfer across the registers, that is in the direction V, may be effected between the adjacent electrodes, and the electrodes used for charge transfer in the direction V may simultaneously be used for charge transfer in one and the same register in the direction H. This results in elimination of the transfer gates or the like across the registers and in improved transfer efficiency. The color signals taken out from the sensor row 20 without positional deviation may be transferred, while the registers 21 to 23 may each be used for the three prime colors to prevent color mixing.

Third Preferred Embodiment

The present third embodiment gives an example of a color line sensor having three separate registers for the three prime colors.

Figure 7:
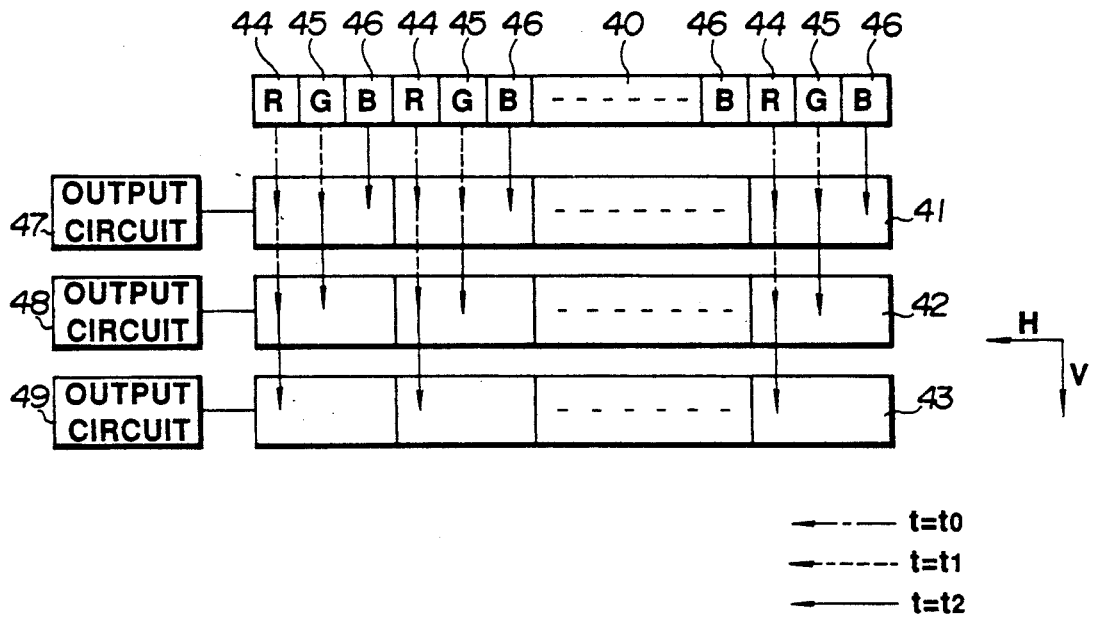
FIG. 7 is a block diagram showing a third embodiment of the charge transfer device of the present invention.

The line sensor of the present embodiment is constituted by a sensor row 40 having the direction H as the longitudinal direction, as shown in FIG. 7. The sensor row 40 is constituted by a sequential linear array of first sensors 44 each having a filter for receiving a red (R) light, second sensors 45 each having a filter for receiving a green (G) light and third sensors 46 each having a filter for receiving a blue (B) light. Three registers 41, 42 and 43 are provided in parallel with and on one lateral side of the sensor row 40 with the same direction H as the longitudinal direction. These first to third registers 41 to 43 sequentially transfer the electrical charges in the direction H. Charge transfer can also be made across the first to third register 41 to 43 in the direction V. Output circuits 47, 48 and 49 are provided at the terminal ends of the registers 41 to 43 in the direction H. These output circuits 47, 48 and 49 issue output signals as a function of signal charges transferred through the registers 41 to 43.

With the above described line sensor, the sensors 44 to 46, which are the light receiving regions, are arrayed in a row without positional deviation for each color. By the following transfer across the registers, electrical charges are allocated to the first register 41, second register 42 and the third register 43 in the form of different color signals.

At time $t_0$, signal charges associated with the red color signals are read out from the first sensor 44 to the first register 41, as shown by a chain dotted line in FIG. 7. At this time, no charges are read from the second sensor 45 or from the third sensor 46.

Then, at time $t_1$, the previously read signal charges of the red signal are transferred from the first register 41 to the second register 42, as indicated by a broken line. Simultaneously, signal charges associated with the green color signal are read from the first sensor 45 to the first register 41, as shown by a broken line. Thus the charges of the red color signals and the green color signals are read to the second register 42 and to the first register 41, respectively.

Then, at time $t_2$, signal charges of the red color signals transferred to the second register 42 are transfereed to the third register 43, while signal charges of the green color signals are transferred from the first register 41 to the second register 42. At this time, signal charges of the blue signals are transferred from the sensor row 40 to the first register 41. By such charge transfer across the registers, signal charges of the blue signals are stored in the first register 41 and signal charges of the green signals are stored in the second register 42, while signal charges of the red signals are stored in the third register 43. Charge transfer is then performed across the registers 41 to 43 in the direction H to take out the outputs in the form of the different color signals from the output circuits 47 to 49.

In this manner, the outputs of the different color signals may be taken out with an advantage for signal processing. Since there are provided the registers associated with the respective colors, the widths of the transfer electrodes of the registers 41 to 43 may be increased, while the transfer frequency may be lowered, thereby improving the transfer efficiency.

Fourth Preferred Embodiment

The present fourth embodiment is a modification of the third embodiment in which registers are provided on both sides of the sensor row.

Figure 8:
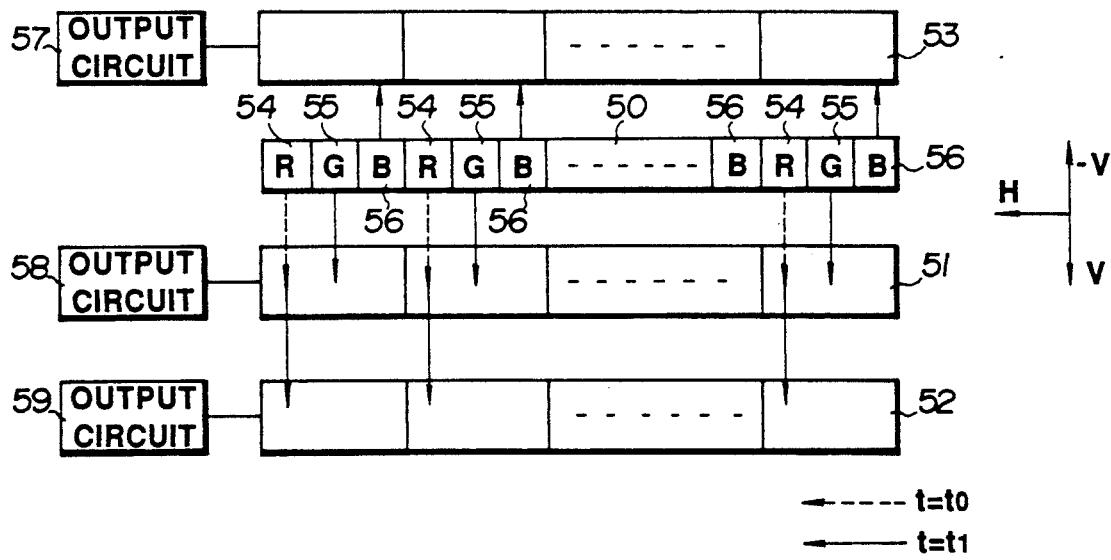
FIG. 8 is a block diagram showing a fourth embodiment of the charge transfer device of the present invention.

With the line sensor of the present embodiment, a sensor row 50 is formed, as shown in FIG. 8, with the direction H as the longitudinal direction. The sensor row 50 is constituted by a sequential linear array of first sensors 54 each having a filter for receiving a red (R) light, second sensors 55 each having a filter for receiving a green (G) light and third sensors 56 each having a filter for receiving a blue (B) light. Three registers 51, 52 and 53 are arrayed on the lateral sides of the sensor row 50. The first register 51 and the second register 52 are arrayed in parallel with and on one lateral side of the sensor row 50, with the direction H as the longitudinal direction, and the third register 53 is arrayed on the other lateral side of and in parallel with the sensor row 50, with the direction H as the longitudinal direction. These registers 51 to 53 transfer the charges sequentially in the direciton H. Output circuits 57, 58 and 59 are provided at the terminal ends of the registers 51 to 53 in the direction H. These output circuits issue output signals associated with signal charges transferred by the registers 51 to 53. The electrical charges may be transferred across the first register 51 and the second register 52, while the signal charges may be read from the sensor row 50 to the first and third registers 51 and 53, in the form of different color signals.

In operation, electrical charges of the red color signals are read at time $t_0$ from the first sensor 54 to the first register 51, as shown by broken line in FIG. 8. No electrical charges are read from the sensors 55, 56 of the line sensor 50.

Then, at time $t_1$ electrical charges of the red signals previously read into the first register 51 are forwarded to the second register 52 by charge transfer across the registers as shown by solid line in FIG. 8. Simultaneously, electrical charges of the green color signals are transferred from the second sensor 55 of the sensor row 50 in the direction V to the first register 51, while electrical charges of the blue color signals are transferred from third sensor 56 of sensor row 50 to the third register 53 in the direction-V, as shown by a solid line in FIG. 8. As a result, electrical charges of the green color signals are stored in the first register 51, and electrical charges of the red color signals are stored in the second register 52, while electrical charges of the blue color signals are stored in the third register 53. The charge transfer is performed in each of the registers 51 to 53 in the direction H so that outputs of different color signals are taken out at the output circuits 57 to 59.

With the above described line sensor of the present fourth embodiment, signals of the different colors may be obtained from the registers 51 to 53 without the problem of color mixing. Only the signals of one and the same type are transferred in each of the registers 51 to 53, so that the number of or the interval between the transfer electrodes in the direction H of the registers 51 to 53 may be reduced, while the transfer frequency may be lowered and the transfer efficiency increased. As compared with the line sensor of the third embodiment, transfer across the registers occurs only once from the first register 51 to the second register 52 so that control signals to the register may be simplified.

Fifth Preferred Embodiment

The present illustrative embodiment is a modification of the first embodiment, in which a first register 81 and a second register 82 for transferring electrical charges in the direction H are provided and the charge transfer may be made across the registers 81, 82 in the direction V.

Figure 9:
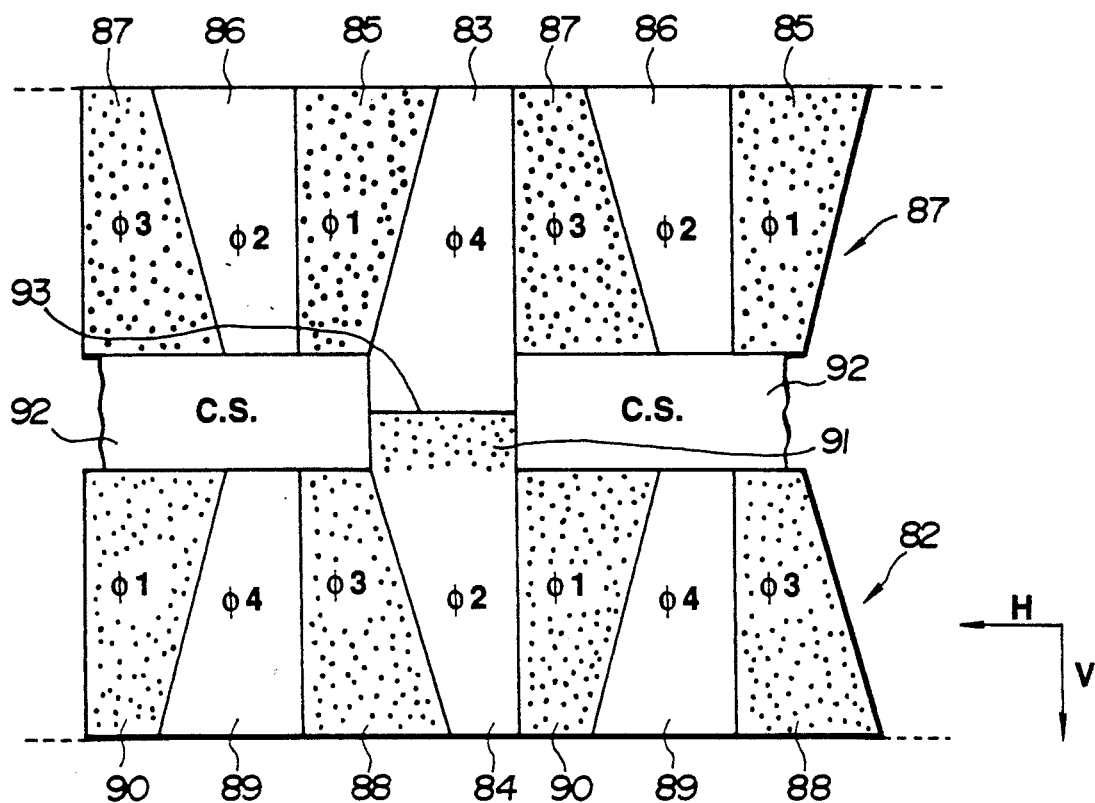
FIG. 9 is a block diagram showing a fifth embodiment of the charge transfer device of the present invention.

In FIG. 9 showing the essential portions of the charge transfer device, the first register 81 and the second register 82 for transferring electrical charges in the direction H are arrayed parallel to each other with the direction H as the longitudinal direction. The first register 81 is provided with transfer electrodes 83, 85, 86 and 87, while the second register 82 is provided with transfer electrodes 84, 88, 89 and 90. The first register 81 and the second register 82 are electrically isolated from each other by a channel stop region 92, while the transfer electrodes 83 and 84 are protruded into the channel stop region 92 and are contiguous to each other at each one side with the channel being contiguous at the transfer electrodes 83 and 84 with the interposition of the junction region 93. The transfer electrodes 83, 84 are substantially trapezoidal in contour and are enlarged towards the junction region 93. The remaining transfer electrodes 85 to 90 are similarly trapezoidal in contour. With the transfer electrodes 83 to 90 of the substantially trapezoidal contour, it become possible to provide for a deep potential at the enlarged sides to improve the transfer efficiency.

One of the four-phase transfer signals $\phi 1$ to $\phi 4$ is supplied to each of the transfer electrodes 83 to 90. The phase 1 signal $\phi 1$ is supplied to the transfer electrodes 85 and 90, while the phase 2 signal $\phi 2$ is supplied to the transfer electrodes 84 and 86. The phase 3 signal $\phi 3$ is supplied to the transfer electrodes 87 and 88, while the phase 4 signal $\phi 4$ is supplied to the transfer electrodes 83 and 89. Of the transfer electrodes 83 to 90, the lower regions of the transfer electrodes 85, 87, 88 and 90 supplied with the signals $\phi 1$ and $\phi 3$ are formed as the transfer regions. The lower regions of the transfer electrodes 83, 84, 86 and 89 supplied with the signals $\phi 2$ and $\phi 4$ are formed as storage regions with a potential well deeper than in the transfer regions. In this manner, the storage and transfer regions are formed alternately in the registers 81 and 82 to improve the transfer efficiency. The lower region of the transfer electrode 84 is substantially formed as the storage section, and a transfer region 91 is formed in the adjacent region. In this manner, the electrical charges are advantageously not left in the adjacent region 93 when the lower channel region of the transfer electrode 84 is reset to the state of storing no electrical charges, while the transfer efficiency across the registers in the direction V may be improved.

Figure 10:
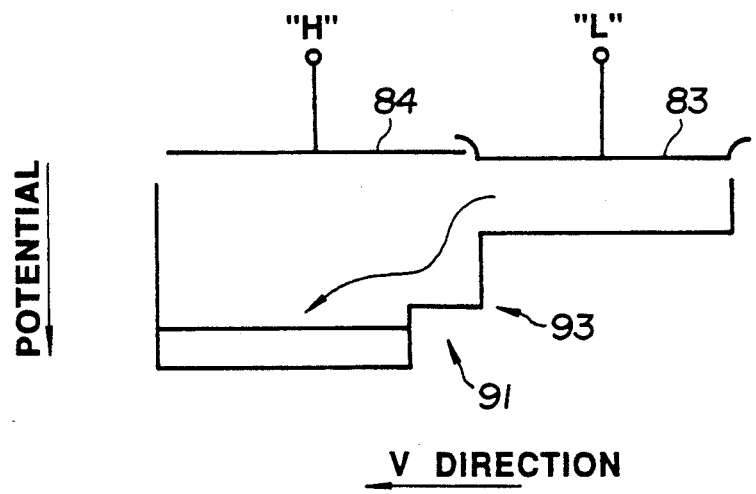
FIG. 10 is a diagram showing the potential energy for illustrating the transfer process of the embodiment shown in FIG. 9.

Referring to FIG. 10, in which the charge transfer across the registers in the direction V is illustrated diagrammatically, the transfer region 91 is formed on the side of the transfer electrode 84 of the adjacent region 93. The potential well of the lower region of the transfer electrode 84 becomes shallower by a region equal to the region of the transfer region 91. In this manner, charge transfer from the lower region of the transfer electrode 83 towards the lower region of the transfer electrode 84 may be performed efficiently because the potential well becomes progressively deeper in the transfer direction.

On the other hand, charge transfer in the region of the signal $\phi 3$ to the region of the signal $\phi 4$ in the direction H may be made thanks to the potential difference even when both the signal φ3 and the signal φ4 are set to the "H" level, so that charge transfer may similarly be realized with a higher transfer efficiency.

What is claimed is:

1. A charge transfer device for transferring signal charges comprising
   a semiconductor substrate,
   a plurality of registers formed on the semiconductor substrate for transferring electrical charges along one or more given directions, the registers being electrically isolated from and parallel to each other, each of the registers including
   a channel layer formed on the semiconductor substrate,
   an insulating film formed on the channel layer, and
   a plurality of trapezoidal shaped transfer electrodes arrayed in juxtaposition along the direction of electrical charge transfer on the insulating film for controlling charge transfer in each of the registers and supplied with respective different control signals, a certain one of the transfer electrodes of one of the registers having the wider of its two parallel sides contiguous to the wider of the two parallel sides of a transfer electrode of an adjacent one of the registers, so that a junction region exists at the point of contiguity, to effect charge transfer across the registers, wherein
   during charge transfer across the adjacent registers, the transfer electrodes arrayed contiguous to each other between the adjacent registers are controlled by externally applied driving signals so that the channel potential of the charge receiving side region thereof becomes greater than the channel potential of the charge forwarding side region thereof.

2. The charge transfer device according to claim 1 wherein
   the transfer electrodes are driven by driving signals of three or more phases,
   at least one of the driving signals, other than the driving signals driving the transfer electrodes arrayed contiguous to each other across the adjacent registers, is a signal which, during transfer of the charges across the adjacent registers, causes a low channel potential with respect to the transfer electrode to which the at least one driving signal is supplied, and wherein
   the driving signals driving the transfer electrodes arrayed contiguous to each other across the adjacent registers are signals which during charge transfer in one and the same register, do not cause a high channel potential simultaneously.

3. The charge transfer device according to claim 2, wherein the transfer electrodes are driven by four-phase driving signals, those transfer electrodes which are arrayed adjacent to each other across the registers are formed in the same register with three other transfer electrodes in between, and wherein
   the transfer electrodes on both sides of the transfer electrodes arrayed adjacent across the registers are supplied with driving signals which decrease the channel potential thereof during transfer of the electrical charges across the registers.

4. The charge transfer device according to claim 1 wherein sensor means are provided for generating signal charges transferred to the plural registers.

* * * * *